(12) United States Patent
Kim et al.

(10) Patent No.: US 8,177,999 B2
(45) Date of Patent: *May 15, 2012

(54) RED PHOSPHOR, METHOD FOR MANUFACTURING THE SAME AND LIGHT EMITTING DIODE FOR USING THE SAME

(75) Inventors: Kyung Nam Kim, Seoul (KR); Sang Mi Park, Gunpo (KR); Tomizo Matsuoka, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 1031 days.

This patent is subject to a terminal disclaimer.

(21) Appl. No.: 11/997,547

(22) PCT Filed: Jun. 30, 2006

(86) PCT No.: PCT/KR2006/002586
§ 371 (c)(1),
(2), (4) Date: Jan. 31, 2008

(87) PCT Pub. No.: WO2007/018351
PCT Pub. Date: Feb. 15, 2007

(65) Prior Publication Data
US 2009/0102354 A1    Apr. 23, 2009

(30) Foreign Application Priority Data

Aug. 10, 2005  (KR) .................. 10-2005-0073421

(51) Int. Cl.
*C09K 11/56* (2006.01)
*C09K 11/08* (2006.01)
*C09K 11/02* (2006.01)
*C09K 11/77* (2006.01)

(52) U.S. Cl. ................. 252/301.4 S; 352/301.4 R
(58) Field of Classification Search ........... 252/301.4 R, 252/301.4 S
See application file for complete search history.

(56) References Cited

U.S. PATENT DOCUMENTS

| 4,065,688 A | 12/1977 | Thornton |
| 5,629,126 A * | 5/1997 | Trutna et al. ............ 430/139 |
| 2008/0191228 A1 * | 8/2008 | Kim et al. ................ 257/98 |
| 2008/0191229 A1 * | 8/2008 | Kim et al. ................ 257/98 |

FOREIGN PATENT DOCUMENTS

| JP | 53-120866 | 10/1978 |
| JP | 57-128772 A | 8/1982 |
| JP | 2003-064357 | 3/2003 |
| JP | 2005-079500 A2 | 3/2005 |
| JP | 2005-509081 | 4/2005 |
| KR | 10-2005-0117165 A | 12/2005 |
| KR | 10-2006-0063586 | 6/2006 |
| KR | 10-2007-0002385 | 1/2007 |
| WO | 03/042327 | 5/2003 |
| WO | 2004-007636 | 1/2004 |
| WO | 2006-043200 | 4/2006 |
| WO | 2006-126817 | 11/2006 |

OTHER PUBLICATIONS

Oberacker. Field quenching effects in polycrystalline SrS:Pb and SrS:Ce,Pb thin films for electroluminescence devices. J. Appl. Phys. vol. 80, No. 6, 3526-3531.*

* cited by examiner

*Primary Examiner* — Carol M Koslow
*Assistant Examiner* — Matthew Hoban
(74) *Attorney, Agent, or Firm* — H.C. Park & Associates, PLC

(57) ABSTRACT

The present invention provides a red phosphor, a method for manufacturing the red phosphor and a light emitting device using the red phosphor, in which the red phosphor is expressed as a chemical formula of $(Ca,Sr)_{1-x-y}Eu_xPb_yS$, wherein $0.0005 \leq x \leq 0.01$ and $0.001 \leq y \leq 0.05$.

According to the present invention, the red phosphor has improved reliability and luminous efficiency and thus be used to obtain a light emitting device with more excellent color reproducibility and optical characteristic.

9 Claims, 3 Drawing Sheets

RED PHOSPHOR, METHOD FOR MANUFACTURING THE SAME AND LIGHT EMITTING DIODE FOR USING THE SAME

RELATED APPLICATIONS

This application is a U.S. national phase application of PCT International Application No. PCT/KR2006/002586, filed Jun. 30, 2006, which claims priority of Korean Patent Application No. 10-2005-0073421, filed Aug. 10, 2005, the contents of which are incorporated herein by reference in their entirety.

FIELD OF THE INVENTION

The present invention relates to a red phosphor, a method for manufacturing the red phosphor and a light emitting device using the red phosphor.

BACKGROUND OF THE INVENTION

A light emitting diode (LED) is a compound semiconductor having p-n junction structure of semiconductor and refers to a device for emitting predetermined light through recombination of minority carriers (electrons or holes). LEDs include a red LED using GaAsP or the like, a green LED using GaP or the like, a blue LED using an InGaN/AlGaN double hetero structure, and the like.

A light emitting device using the LED has characteristics of low power consumption, a long lifespan, installation in a narrow space, and strong resistance against vibration. In recent years, white light emitting devices in addition to single color light emitting devices, e.g. red, blue or green light emitting devices, have been placed on the market. As the white light emitting devices are applied to products for automobiles and illumination, it is expected that their demands will be rapidly increased.

In the light emitting device technologies, the methods of implementing white color can be roughly classified into two types. The first one is a method in which red, blue and green LED chips are arranged to be adjacent to one another and colors of light emitted from the respective LEDs are mixed to implement white color. However, since the respective LED chips have different thermal or temporal characteristics, there are problems in that uniform color mixing cannot be obtained due to changes in a color tone according to usage environment, particularly, the occurrence of color spots, or the like, and thus, the brightness is not sufficiently high. Further, the circuit configurations for operating the respective LED chips are complex, and it is difficult to implement perfect white light since it is difficult to obtain optimal conditions for mixing three color lights depending on the positions of the chips. Moreover, since its color rendering index is as low as about 40, there is a problem in that it is not suitable for the general lighting source or the flash.

The second one is a method in which a phosphor is disposed on an LED chip and the color of a portion of primary light emitted from the LED chip and the color of secondary light of which wavelength has been converted by the phosphor are mixed to implement white color. For example, onto an LED chip for emitting blue light is attached a phosphor that emits yellowish green or yellow using a portion of the blue light as an excitation source, so that white light can be obtained by mixing the blue light emitted from the light emitting diode chip and the yellowish green or yellow light emitted from the phosphor. However, there is a problem in that such a light emitting device corresponds to light emission from a single yellow phosphor and has a low color rendering index due to spectrum shortage of green and red colors.

In order to solve the problem related to the low color rendering index as described above, a blue LED chip and green and red phosphors excited by the blue light of the blue LED chip are used to manufacture a white light emitting device. That is, the white light with a high color rendering index of 85 or more can be implemented by mixing blue light with green and red light emitted from the phosphors excited by the blue light. At this time, a thiogallate based phosphor excited by blue light to emit green to yellow light is used as a green light emitting phosphor. The typical thiogallate based phosphor has a composition expressed as $(Ca,Sr,Ba)(Al,Ga,In)_2S_4$:Eu(or Ce). Among the composition, a $SrGa_2S_4$:Eu phosphor is a green light emitting phosphor with high luminous intensity. Meanwhile, SrS:Eu, (Sr,Ca)S:Eu, CaS:Eu and the like are used as a red light emitting phosphor excited by the blue light to emit red light.

However, since the red phosphor has very poor luminous characteristics, a red phosphor with excellent luminous efficiency needs be developed. Specifically, the red light emitting phosphor expressed as (Sr,Ca)S:Eu has low luminous intensity and poor chemical stability against moisture. As a result, the application of the red phosphor to a general lighting source and LCD backlight lighting device is restricted.

The present invention is conceived to solve the aforementioned problems in the prior art. Accordingly, an object of the present invention is to provide a red phosphor with improved reliability and luminous efficiency and a method for manufacturing the same. Another object of the present invention is to provide a light emitting device with more excellent color reproducibility and optical characteristics using the red phosphor with improved reliability and luminous efficiency.

According to an aspect of the present invention for achieving the objects, there is provided a red phosphor having a chemical formula of $(Ca,Sr)_{1-x-y}Eu_xPb_yS$, wherein $0.0005 \leq x \leq 0.01$ and $0.001 \leq y \leq 0.05$. Preferably, a range of x is $0.001 \leq x \leq 0.005$ and a range of y is $0.005 \leq y \leq 0.03$.

The red phosphor may emit light with a wavelength of 600 nm to 660 nm. According to another aspect of the present invention, there is provided a method for manufacturing a red phosphor, comprising the steps of quantifying starting materials containing Sr, Ca, Eu and Pb, respectively, and dissolving the starting materials in nitric acid or hydrochloric acid; adding $(NH_4)_2CO_3$ or $(NH_4)_2C_2O_4$ to precipitate the solution in a state where the respective starting materials are dispersed; and drying the precipitate and then heat-treating the dried precipitate at a temperature of 900 to 1250° C. for 1 to 5 hours under a sulfur dioxide atmosphere. Preferably, the starting material is selected from the group consisting of $SrCO_3$, $CaCO_3$, $Eu_2O_3$ and $Pb(NO_3)_2$.

According to a further aspect of the present invention, there is provided a light emitting device, comprising a light emitting diode chip; and a red phosphor having a chemical formula of $(Ca,Sr)_{1-x-y}Eu_xPb_yS$, wherein $0.0005 \leq x \leq 0.01$ and $0.001 \leq y \leq 0.05$. The light emitting diode chip may emit blue light or ultraviolet rays. Preferably, the light emitting diode chip emits blue light and the light emitting device further includes a green light emitting phosphor. Preferably, the green light emitting phosphor is $(Ba,Sr,Ca)_2SiO_4$:Eu or $SrGa_2S_4$:Eu.

Preferably, the light emitting diode chip is mounted on a body, a molding portion for sealing the light emitting diode chip is formed over the body, and the phosphor is distributed in the molding portion. The body may be any one of a substrate, a heat sink and a lead terminal.

Advantageous Effect

According to the present invention, a red phosphor with excellent luminous intensity can be manufactured by using a novel composition of the red phosphor due to the partial substitution of a Pb element into the phosphor. Further, a problem in which the red phosphor has had poor chemical stability against moisture can be solved, and thus, the reliability thereof can also be improved.

Since the red phosphor of the present invention emit red light with very excellent luminous efficiency under the excitation of light in a long wavelength ultraviolet region and blue region, it can be employed as an excellent lighting source when manufacturing white light emitting diodes using ultraviolet light as well as blue light.

According to the present invention, the light emitting device with excellent color reproducibility and optical characteristics can be manufactured by using the red phosphor with good reliability and improved luminous efficiency. Since the light emitting device of the present invention can implement white light with a higher color rendering index of 90 or more, it can be used not only as a general lighting source but also as an LCD backlight source due to excellent color rendering and reproducibility.

DETAILED DESCRIPTION

Figure 1:
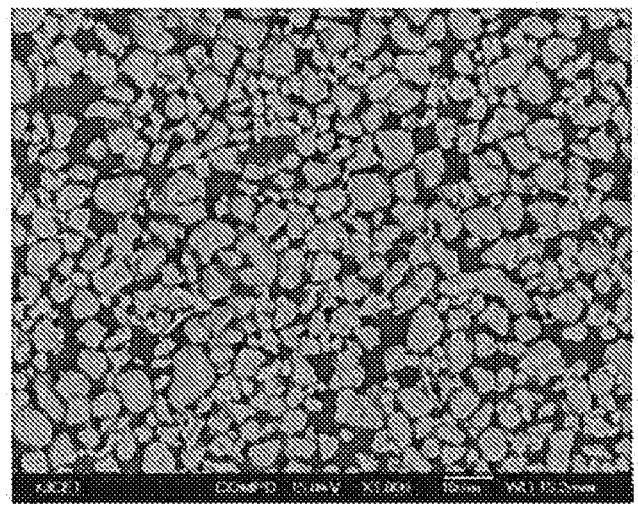
FIG. 1 is a scanning electron microscope photograph of a red phosphor according to the present invention.

Hereinafter, an embodiment of the present invention will be described in detail with reference to the accompanying drawings. However, the present invention is not limited to a preferred embodiment set forth herein but can be implemented in different forms. Rather, the preferred embodiment is merely provided to allow the present invention to be completely described herein and to fully convey the scope of the invention to those skilled in the art. In the drawings, like elements are designated by the same reference numerals.

A phosphor is composed of a host lattice and an active ion doped with an impurity at a predetermined position, and the active ion serves to determine an energy level related to a light emitting process to thereby determine a light emitting color. The light emitting color is determined by an energy gap between the ground state of the active ion and the excitation state thereof in the lattice structure. That is, the main light emitting color of the phosphor having the active ion is ultimately determined by an electronic state of the active ions, i.e. the energy level. For example, in case of $Tb^{3+}$ ion, a transition from 5d to 7f is most probable in the host lattice, thereby resulting in a yellow-green light emitting phenomenon.

There are various kinds of phosphors using such energy gaps, and light emitting diodes with various light emitting colors, specifically a white light emitting diode, can be manufactured by using the various phosphors.

The present invention provides a phosphor with a novel composition whose luminous efficiency and chemical stability against moisture can be improved through partial substitution of a Pb element into the conventional red light emitting phosphor expressed as (Sr,Ca)S:Eu.

The red phosphor of the present invention has a structure such as the following chemical formula (1).

$$(Ca,Sr)_{1-x-y}Eu_xPb_yS \qquad (1)$$

wherein $0.0005 \leq x \leq 0.01$ and $0.001 \leq y \leq 0.05$. More preferably, a range of x is $0.001 \leq x \leq 0.005$ and a range of y is $0.005 \leq y \leq 0.03$.

A small quantity of Eu is used as a main light emitting element which causes light emission through an electron energy transition from an f-d excited state to an f ground state.

The light emission wavelength can be adjusted depending on the composition of the phosphor of the chemical formula (1), i.e. depending on the ratio of Sr, Ca and Pb. An excellent emission spectrum with a wavelength range of 600 to 660 nm can be obtained.

Hereinafter, a method for manufacturing the aforementioned red phosphor will be described.

First, a starting material for synthesizing a phosphor is prepared. $SrCO_3$, $CaCO_3$, $Eu_2O_3$ and $Pb(NO_3)_2$ can be used as the starting materials of Sr, Ca, Eu and Pb, respectively. That is, alkaline earth metal materials, i.e. $SrCO_3$, $CaCO_3$ and $Pb(NO_3)_2$, and an active agent, i.e. $Eu_2O_3$, are prepared, and they are then mixed at a mole ratio for obtaining a desired composition and dissolved in nitric acid or hydrochloric acid. Then, an excess quantity of $(NH_4)_2CO_3$ or $(NH_4)_2C_2O_4$ is added to precipitate the mixture in a state where the respective starting materials are dispersed. After the precipitate has been completely dried, the heat treatment process at a temperature of 900 to 1250° C. for 1 to 5 hours under a sulfur dioxide atmosphere is repeated for the dried precipitate such that the dried precipitate can be completely converted from carbide to sulfide.

The red phosphor manufactured through such a manufacturing process has a particle distribution of 2 to 30 micrometer and exhibits higher red light emitting intensity. FIG. 1 is a scanning electron microscope photograph of a red phosphor according to the present invention, i.e. a $Ca_{0.987}Eu_{0.003}Pb_{0.01}S$ phosphor with Pb substituted at a ratio of 0.01. Referring to FIG. 1, the red phosphor according to the present invention has a particle distribution of 2 to 30 μm.

Figure 2:
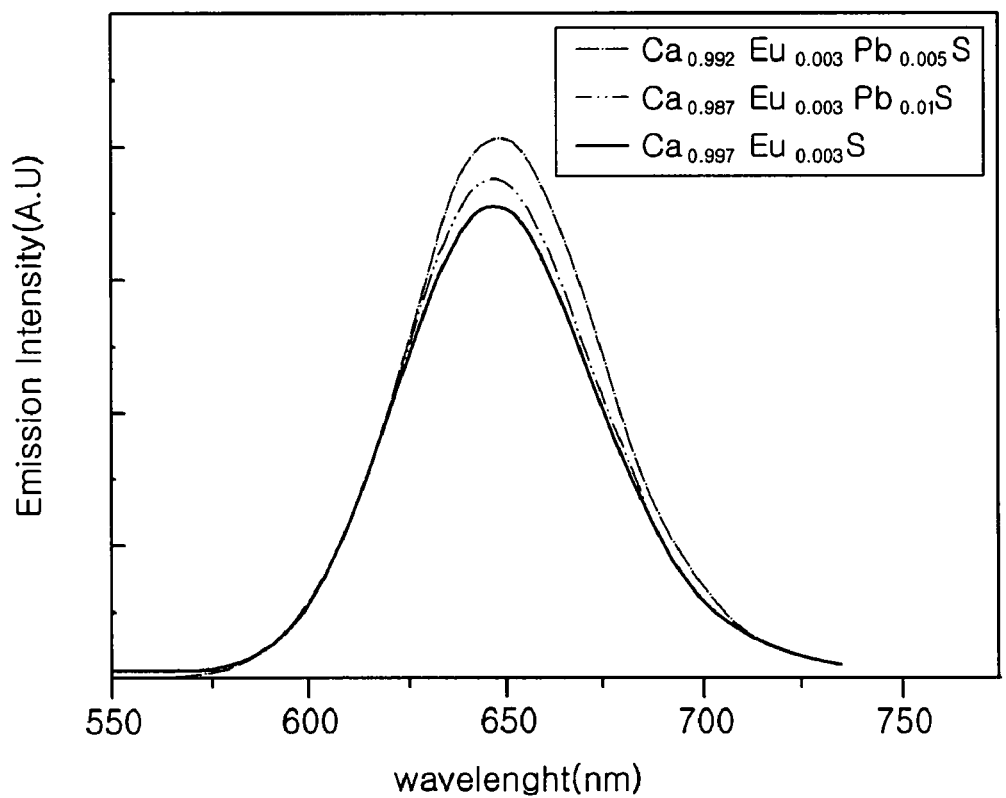
FIG. 2 is a graph plotting a luminous intensity change depending on a Pb ratio in the red phosphor according to the present invention.

Further, FIG. 2 is a graph illustrating a luminous intensity change depending on a Pb ratio in the red phosphor, i.e. $Ca_{0.997-y}Eu_{0.003}Pb_yS$ phosphor, according to the present invention. Referring to FIG. 2, the red phosphor of the present invention in which Pb is partially substituted has luminous intensity higher than the conventional red phosphor in which Pb is not contained. Specifically, the $Ca_{0.992}Eu_{0.003}Pb_{0.005}S$ phosphor has the luminous intensity about 10% higher than that of the $Ca_{0.997}Eu_{0.003}S$ phosphor.

As described above, the conventional red phosphor expressed as (Sr,Ca)S:Eu has been widely used as a component that is excited by blue light to emit red light. However, the (Sr,Ca)S:Eu phosphor easily reacts with moisture and thus its chemical structure changes into hydrogen disulfide and alkaline earth metal sulfate. Therefore, the red spectrum of the (Sr,Ca)S:Eu red phosphor is gradually diminished due to the chemical reaction of the red phosphor with moisture, and the hydrogen disulfide generated as a by-product causes a phenomenon in which optical characteristics of the phosphor is rapidly deteriorated, i.e. a metal component in the light emitting device corrodes.

On the other hand, the red phosphor expressed as $(Ca,Sr)_{1-x-y}Eu_xPb_yS$ is manufactured by using the manufacturing method of the present invention as described above, so that the chemical reaction with moisture can be prevented and the chemical reliability can also be improved instability by eliminating the chemical instability.

Figure 3:
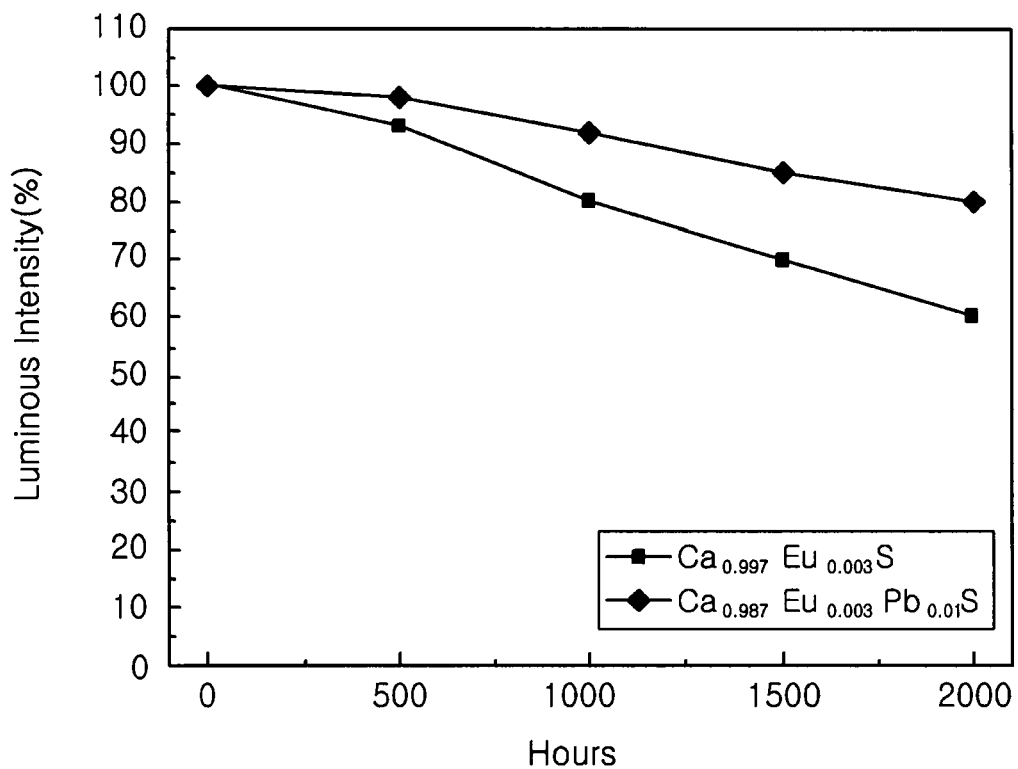
FIG. 3 is a graph comparing changes in luminous intensity and colors of light emitting devices manufactured by using the red phosphor of the present invention and the conventional red phosphor with each other.

FIG. 3 is a graph comparing changes in luminous intensity and colors of light emitting devices manufactured by using the red phosphor of the present invention and the conventional red phosphor. For a light emitting device using the conventional $Ca_{0.997}Eu_{0.003}S$ phosphor and a light emitting device using the $Ca_{0.987}Eu_{0.003}Pb_{0.001}S$ phosphor of the present invention in which Pb is partially substituted, the reliability test was performed under an exterior environment in which 90% of moisture is contained at a temperature of 60° C., and the change in the luminous intensity with respect to an initial value defined as 100 was illustrated. Here, the reason that the luminous intensity is gradually decreased over time is that the optical characteristics of the phosphor are lost due to the reaction of the phosphor with moisture and its subsequent decomposition. As shown in this figure, it can be noted that the red phosphor of the present invention in which Pb is partially substituted has considerably smaller reduction in the luminous intensity than the conventional red phosphor. That is, since the red phosphor of the present invention has excellent stability against moisture, the decrease in the optical characteristics due to the chemical reaction of the phosphor with moisture can be prevented.

As described above, since a Pb element is partially substituted into the conventional red phosphor expressed as (Sr,Ca)S:Eu, very excellent red light can be implemented under the excitation in a long wavelength ultraviolet region and a blue region. Further, a red phosphor with improved reliability can be manufactured due to excellent chemical stability against moisture.

Hereinafter, a light emitting device using the phosphor according to the present invention so configured will be described with reference to the accompanying drawings.

Figure 4:
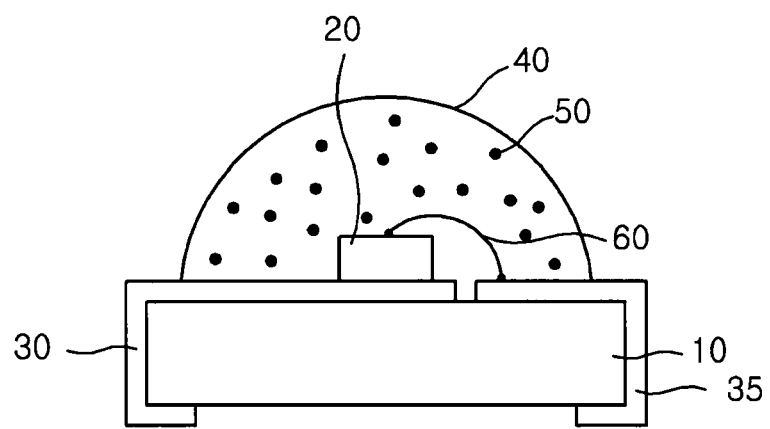
FIG. 4 is a sectional view showing a chip-type light emitting device according to the present invention.

FIG. 4 is a sectional view showing a chip-type light emitting device manufactured by using the red phosphor of the present invention.

Referring to this figure, the light emitting device comprises a substrate 10, first and second electrodes 30 and 35 formed on the substrate 10, a light emitting diode chip 20 mounted on the first electrode 30, and a molding portion 40 for sealing the light emitting diode chip 20. The red phosphor as described above is uniformly distributed in the molding portion 40.

The substrate 10 may be formed with a predetermined groove around its central region in which the light emitting diode chip 20 is mounted, such that a sidewall surface of the groove can be inclined at a predetermined inclination. At this time, the light emitting diode chip 20 is mounted on a bottom surface of the groove, and the sidewall surface with a predetermined inclination allows the light emitted from the light emitting diode chip 20 to be maximally reflected and the luminous efficiency to be increased.

Further, the substrate 10 may further comprise a heat sink for releasing the heat generated from the light emitting diode chip 20 to the outside. For example, a predetermined area on the substrate 10 where the light emitting diode chip 20 will be mounted is removed to form a through hole in which the heat sink is in turn inserted and mounted, and the light emitting diode chip 20 is mounted on the heat sink. Preferably, the heat sink is made of a material with excellent thermal conductivity. Most preferably, the heat sink is made of a material with excellent thermal and electrical conductivity.

The first and the second electrodes 30 and 35 are electrodes which are formed on the substrate 10 and connected to anode and cathode terminals of the light emitting diode chip 20, respectively. The first and the second electrodes 30 and 35 may be formed by using a printing technique. The first and the second electrodes 30 and 35 are made of a metallic material such as copper or aluminum with excellent conductivity and configured to be electrically disconnected from each other.

The light emitting diode chip 20 is a GaN, InGaN, AlGaN or AlGaInN based light emitting diode chip for emitting blue light. In the present embodiment, a light emitting diode chip for emitting blue light in the range of 420 to 480 nm is used. However, the present invention is not limited thereto but may uses a light emitting diode chip which emits ultraviolet rays as well as the blue light. Further, only one light emitting diode chip 20 may be used or a plurality of light emitting diode chips may be used if desired.

The light emitting diode chip 20 is mounted on the first electrode 30 and electrically connected to the second electrode 35 through a wire 60. Alternatively, in a case where the light emitting diode chip 20 is not mounted on the first or second electrode 30 or 35 but formed on the substrate 10, it can be connected to the first and second electrodes 30 and 35 through two wires 60, respectively.

Further, the molding portion 40 for sealing the light emitting diode chip 20 is formed on the substrate 10. As described above, the red phosphor 50 expressed as $(Ca,Sr)_{1-x-y}Eu_xPb_yS$ is uniformly distributed in the molding portion 40. The molding portion 40 may be formed through an injection process using a mixture of a predetermined transparent epoxy or silicone resin and the phosphor 50. Alternatively, the molding portion 40 may be formed in such a manner that it is manufactured using a separate mold and then pressed or heat treated. The molding portion 40 may be formed into various shapes such as an optical lens type, a flat plate type, a type in which unevenness is formed on its surface.

The phosphor 50 may be uniformly distributed in the molding portion 40 as shown in this figure, or may be formed on the light emitting diode chip 20 through a dotting process.

Figure 5:
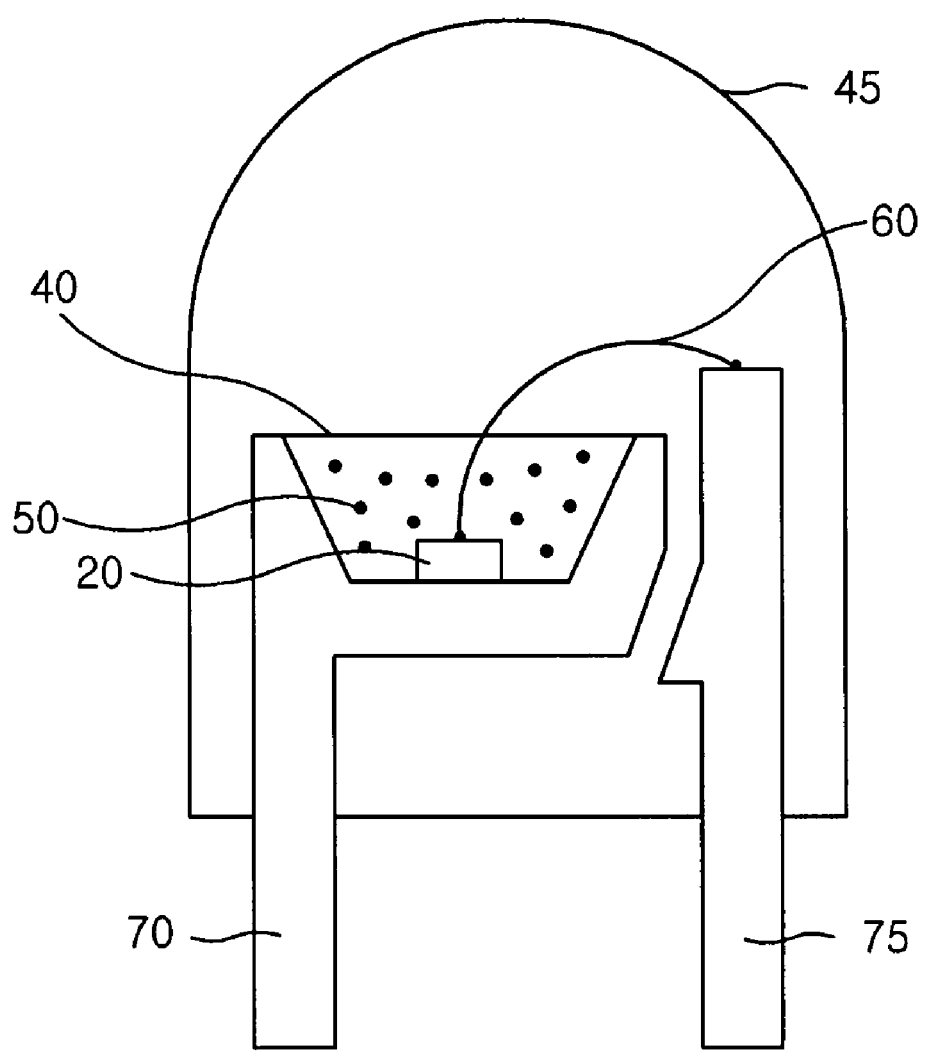
FIG. 5 is a sectional view showing a lamp-type light emitting device according to the present invention.

FIG. 5 is a sectional view showing a lamp-type light emitting device manufactured by using the red phosphor according to the present invention.

Referring to this figure, the light emitting device comprises a first lead terminal 70 with a reflection portion formed thereon, and a second lead terminal 75 spaced apart from the first lead terminal 70 by a predetermined interval. A light emitting diode chip 20 is mounted in the reflecting portion of the first lead terminal 70 and electrically connected to the second lead terminal 75 through a wire 60. A molding portion 40 containing the phosphor 50 is formed above the light emitting diode chip 20, and an outer peripheral molding portion 45 manufactured through a mold is formed on front ends of the first and second lead terminals 70 and 75. In the molding portion 40 is uniformly distributed the red phosphor 50 which is expressed as $(Ca,Sr)_{1-x-y}Eu_xPb_yS$ and absorbs light emitted from the light emitting diode chip 20 to convert the light into light with red wavelength. The outer peripheral molding portion 45 is made of a transparent epoxy or silicone resin to improve the transmittance of the light emitted from the light emitting diode chip 20.

In such a light emitting device according to the present invention, primary light is emitted from the light emitting diode chip 20 and allows the phosphor 50 to emit secondary light with converted wavelength such that color in a desired spectrum region can be implemented through the mixing of the primary and secondary lights. That is, the blue light is emitted from the blue light emitting diode chip and causes the red phosphor to emit red light with excellent luminous intensity. Accordingly, a portion of the blue light, i.e. the primary light, can be mixed with the red light, i.e. the secondary light, to implement pastel-based light which ranges from pink to purple.

Other phosphors with various compositions may be further included to implement a desired color. Specifically, the light emitting device may further include a green phosphor as well as the red phosphor expressed as $(Ca,Sr)_{1-x-y}Eu_xPb_yS$ on the light emitting diode chip in order to implement the white light emission. The green phosphor may include a $(Ba,Sr,Ca)_2SiO_4$:Eu phosphor or a $SrGa_2S_4$:Eu phosphor. At this time, the blue light emitting diode chip emits blue light by which the red and green phosphors are excited to emit red and green lights, respectively. Accordingly, a portion of the blue light (the primary light) can be mixed with the red and green lights (the secondary light) to implement white light. Such a white light emitting diode can have a color rendering index of 90 which is increased by about 10% or less as compared with the conventional white light emitting device with a color rendering index 85 which uses the conventional blue light emitting diode chip and the YAG:Ge yellow phosphor.

As such, the light emitting device of the present invention can implement white light whose a color rendering index is higher than that of the conventional light emitting device and can improve the color reproducibility and uniformity by using the red phosphor with excellent luminous efficiency. Further, since the light emitting device of the present invention comprises the red phosphor with superior stability against moisture to the conventional one, the lifespan of the red phosphor can be lengthened to thereby improve reliability of the light emitting device.

The technical spirit and features of the present invention are not limited to the aforementioned embodiment but may be modified or changed in various ways. Therefore, the present invention can be applied to a variety of articles.

The invention claimed is:

1. A red phosphor having a chemical formula:

$$(Ca,Sr)_{1-x-y}Eu_xPb_yS,$$

wherein $0.0005 \leq x \leq 0.01$ and $0.001 \leq y \leq 0.05$.

2. The red phosphor as claimed in claim 1, wherein $0.001 \leq x \leq 0.005$ and $0.005 \leq y \leq 0.03$.

3. The red phosphor as claimed in claim 1, wherein the red phosphor emits light with a wavelength of 600 nm to 660 nm.

4. A light emitting device, comprising:
a light emitting diode chip; and
a red phosphor having a chemical formula of $(Ca,Sr)_{1-x-y}Eu_xPb_yS$,
wherein $0.0005 \leq x \leq 0.01$ and $0.001 \leq y \leq 0.05$.

5. The light emitting device as claimed in claim 4, wherein the light emitting diode chip emits blue light or ultraviolet rays.

6. The light emitting device as claimed in claim 4, wherein the light emitting diode chip emits blue light, and the light emitting device further includes a green light emitting phosphor.

7. The light emitting device as claimed in claim 6, wherein the green light emitting phosphor is $(Ba,Sr,Ca)_2SiO_4$:Eu or $SrGa_2S_4$:Eu.

8. The light emitting device as claimed in claim 4, wherein the light emitting diode chip is mounted on a body, a molding portion for sealing the light emitting diode chip is formed over the body, and the phosphor is distributed in the molding portion.

9. The light emitting device as claimed in claim 8, wherein the body is one selected from the group consisting of a substrate, a heat sink and a lead terminal.

* * * * *